Feb. 27, 1962 E. MUNDT 3,023,363

RATE DIVIDER CIRCUIT

Filed Sept. 28, 1959

INVENTOR:
Edward Mundt

By Forrest J. Lilly
Attorney.

United States Patent Office 3,023,363

Patented Feb. 27, 1962

3,023,363

RATE DIVIDER CIRCUIT

Edward Mundt, Pasadena, Calif., assignor to Hycon Mfg. Company, Pasadena, Calif., a corporation of Delaware Filed Sept. 28, 1959, Ser. No. 842,915
11 Claims. (Cl. 328—30)

My present invention relates generally to rate dividers and more particularly to a rate divider circuit for accurately dividing an input frequency by any selected number to produce essentially any desired output frequency.

Rate dividers are normally used to produce different lower output frequencies from some reference input frequency. The reference input frequency is almost always constant and established, for example, by a crystal controlled oscillator. The reference input frequency can be easily divided by two with a bistable device. Further divisions of the divided frequency can, of course, be obtained by utilizing a sequence of such bistable multivibrators connected in serial fashion. It is obviously possible to provide almost any desired output frequency which is equal to the reference input frequency divided by an even number. Such rate dividers are used extensively in television and computer circuitry.

It is possible to divide a reference input frequency by odd as well as even numbers in a counting circuit wherein a storage capacitor receives input pulses at the reference input frequency and a comparator is connected to compare the capacitor voltage with some predetermined voltage level, to produce an output signal and simultaneously discharge the capacitor whenever the storage capacitor reaches the predetermined voltage level. By adjusting this operating level at which the comparator responds, an output signal can be obtained for any predetermined number of input pulses. Such dividers are, however, analogue devices and are not highly accurate, particularly for large divisor numbers that would establish an operating (comparator response) level in the low slope portion of the usual exponential charging curve for a capacitor. Counting ratios are limited to about 10 for such storage counting, comparator circuits. Storage capacitor leakage also affects the operation and accuracy of such dividers.

It is an object of my invention to provide a rate divider circuit which is capable of accurately dividing an input frequency by any odd or even number.

Another object of my invention is to provide a rate divider circuit wherein extremely accurate frequency division can be performed with large divisor numbers.

A further object of the invention is to provide a rate divider circuit which produces accurate rate division for any selected input frequency from a plurality of available input frequencies.

A still further object of my invention is to provide a rate divider circuit in which accurate rate division can be automatically performed with an input frequency which can be variable over a wide range of frequencies.

Briefly, and in general terms, the foregoing and other objects are preferably accomplished by providing a multiple stage digital counter having an input which is adapted to be connected to a source of trigger signals of a reference frequency, and an output which is connected to a blocking oscillator capable of producing a reset pulse and an output pulse for each counter output signal. Each reset pulse is of a predetermined pulse width, preferably equal in time duration to some integral number of trigger cycles of the reference frequency. A control network having symmetrical halves of circuitry is associated respectively with each counter stage of the multiple stage digital counter. Each control network is connected to receive the reset pulse for resetting the corresponding counter stage (a bistable multivibrator, for example) according to the existence of a high and a low bias potential on the symmetrical halves of the control network. The symmetrical halves of each control network are connected to respective sides of the corresponding counter stage. Each control network has an input relay connected to control and produce the high and the low bias potentials on the respective halves of the control network in accordance with the energization or non-energization of the input relay. When an input relay is energized, the high and low bias potentials existing on the respective halves of the control network before the input relay was energized, are reversed (interchanged) to opposite sides (halves). Depending upon the energization or non-energization of the different input relays, the respectively corresponding counter stages can be reset by the reset pulse, which is applied to the counter stages through their respective control networks, to states dependent upon the relative positioning of the high and the low bias potentials on the two halves of each control network. The counter stages are therefore each reset to a state established by the respective input relays.

The digital counter is reset to a condition representing the register complement of the number by which the input reference frequency is to be divided. Thus, the digital counter produces a reset pulse and an output pulse from the blocking oscillator whenever the number (divisor) is replaced in the counter by the input trigger signals entering at the reference frequency. The divisor number can be represented by the proper energization or non-energization of correct input relays, and the respective control networks are properly connected to the corresponding counter stages to produce the register complement of the divisor number in the digital counter, for each reset pulse resulting from a counter output signal. The known delay due to the pulse width of the applied reset pulse can be suitably incorporated into the divisor number. The provision of means for varying the reset pulse width proportionately with variation of the reference frequency permits accurate division over a wide range of input reference frequencies.

My invention possesses other objects and features, some of which together with the foregoing, will be set forth in the following detailed description of a preferred embodiment of the invention, and the invention will be more fully understood by reading the description with joint reference to the attached drawings, in which.

Figure 1:
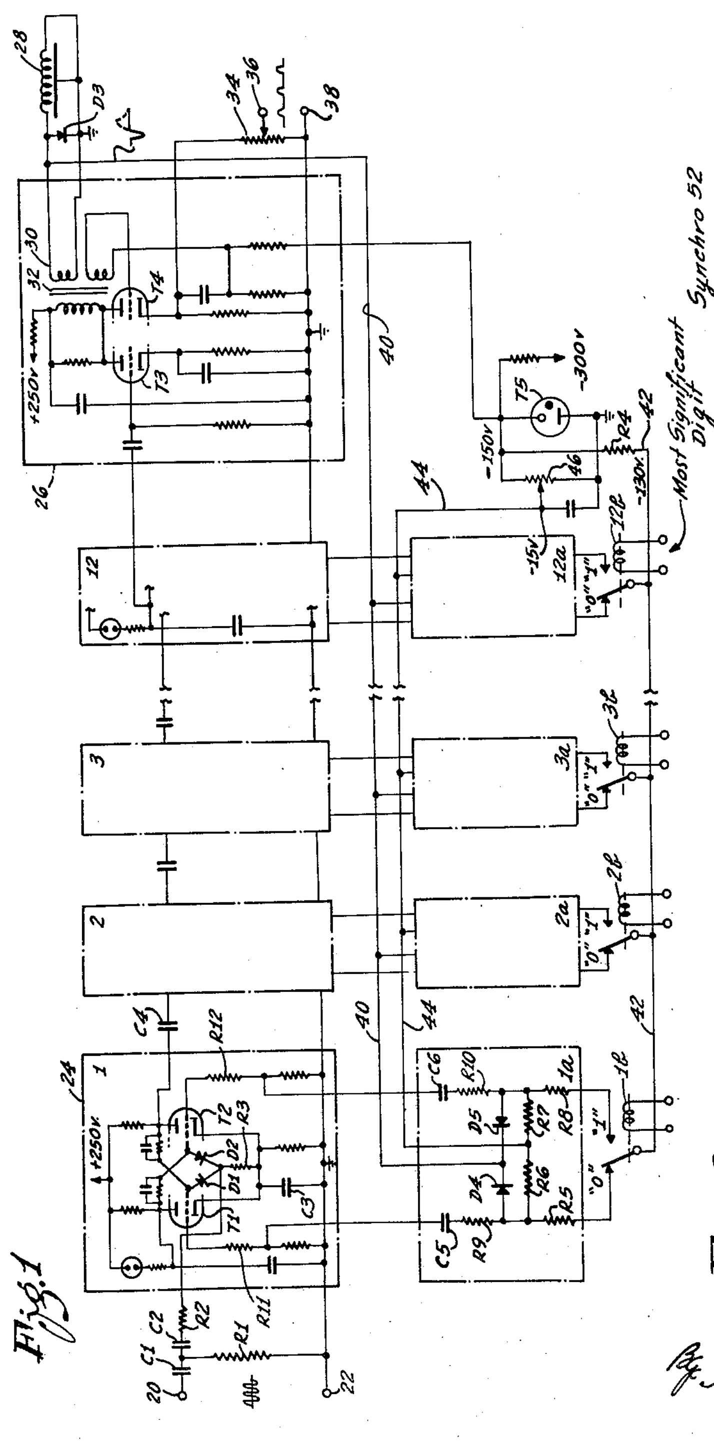
FIGURE 1 is a detailed wiring diagram of a preferred embodiment of my rate divider circuit.

Detailed circuitry of a preferred embodiment of my invention is shown in FIGURE 1. A normally constant frequency input signal is applied between input terminals 20 and 22. This signal is illustratively depicted as a sine wave signal in FIGURE 1 of, for example, 100 volts magnitude and one megacycle per second frequency. It is to be noted that this input signal is not necessarily limited to a sine wave and, in practice, periodic negative trigger impulses may be preferred. Further, whether the input signal is a sine wave or negative impulses, there can be some fluctuation or variation of input frequency, which frequency can be accurately divided down by any desired odd or even number, as permitted by the particular circuitry provided. The input signal of one megacycle per second frequency, however, can be preferably derived from a crystal controlled oscillator to provide a constant frequency input signal which can be considered frequency invariable for the ensuing description of the rate divider circuit of FIGURE 1.

The input signal is applied through an input network including series connected capacitors C1 and C2, a shunt resistor R1 connecting the common junction between capacitors C1 and C2 to terminal 22 (ground), and an isolating resistor R2 connected in series with the capacitor C2, as illustrated in FIGURE 1, to a two tube bistable multivibrator 24. The bistable multivibrator 24 is, for example, a Walkirt type M1553 high speed binary. Twelve identical stages of bistable multivibrators such as 24 are connected serially to form a conventional twelve stage binary counter having counter stages labeled 1, 2, 3, 4, 5, 6, 7, 8, 9, 10, 11 and 12 (stages 4 through 11 are not shown). For counter stage 1, a positive rise (leading edge of a cycle) of the input signal appears through the resistor R2 and resistor R3 but is grounded from the cathodes of tubes T1 and T2 through capacitor C3, so that the bistable multivibrator 24 of stage 1 is unaffected. On the negative fall portion (trailing edge) of each input cycle, the tubes T1 and T2 are however triggered, through the negatively oriented diodes D1 and D2 connecting respectively with the control grids of tubes T1 and T2. A square wave output signal from the anode of tube T2 is obtained and coupled by a capacitor C4 to an identical arrangement of resistor, capacitor and diodes in counter stage 2 corresponding to resistor R3, capacitor C3 and the diodes D1 and D2 of stage 1. The square wave from the anode of T2 is differentiated by the capacitor C4 to provide negative impulses (of −100 volts, for example) for triggering stage 2 in normal manner. The positive impulses are ineffective because of diodes such as D1 and D2, and a capacitor such as C3. This serial triggering action can continue successively down the line through stage 12. The output of counter stage 12, however, is obtained from the anode of a tube corresponding to tube T1 instead of tube T2, of stage 1.

The capacity of the twelve stage binary counter is $2^{12}$ or 4096. As is well known, each binary counter stage can assume either one of two stable states representing the digits 1 or 0. A counter stage can be considered to present a 1 digit when the right hand tube, such as T2 of stage 1, is non-conducting (T1 is conducting) and to present a 0 digit when the tube T2 is conducting (T1 is non-conducting). Thus, the anode voltage of the right hand tube is high for a 1 digit, and is low for a 0 digit, for each counter stage. The transition of a counter stage from a state representing a 1 digit to a state representing a 0 digit therefore produces a negative output (trigger) impulse from the output coupling capacitors such as C4, and a positive output impulse is produced for the transition from a state representing a 0 digit to a state representing a 1 digit. The positive output impulse does not trigger the next stage since it is blocked from the grids by diodes such as D1 and D2, and also grounded through a capacitor such as C3, as described previously. Of course, the last stage 12 produces a positive (rise) output signal when the stage 12 changes from a 1 digit to a 0 digit until it is returned (triggered) back to a 1 digit state, since the output for the last stage is obtained from the anode of the left hand tube corresponding to tube T1 of stage 1. This positive output pulse is differentiated and provides an input signal of proper (positive) polarity to amplifier T3 for triggering the blocking oscillator circuit 26 connected to the last counter stage 12. The negative impulse from the trailing edge of the positive output pulse does not affect amplifier T3.

The blocking oscillator circuit 26 is generally conventional and can be, for example, a Walkirt type M6353 blocking oscillator having a shorted delay line control to provide a counter reset signal of a predetermined pulse width. A shorted delay line 28 is connected to the tertiary winding 30 of the pulse transformer 32. A diode D3 is connected across the tertiary winding 30 to clip the positive trailing overswing portion of the blocking oscillator waveform. The divided frequency output signal is obtained from a potentiometer 34 connected to the cathode of the tube T4 such that positive output pulses (about 10 volts magnitude) are provided between output terminals 36 and 38. The counter reset signal produced by the shorted delay line 28 is, for example, 3 microseconds wide of −80 volts magnitude, and appears on lead 40 to control the output frequency of the signal from potentiometer 34. A counter reset signal, the negative pulse of a predetermined width on lead 40, is produced for each positive output signal from the last counter stage 12, and is used to inactivate the counter for a known time duration and to reset the binary number content of the twelve stage counter to a selected binary number.

Each counter stage is reset by the blocking oscillator reset pulse through a control network for each bistable multivibrator. There are twelve control networks 1*a*, 2*a*, 3*a*, 4*a*, 5*a*, 6*a*, 7*a*, 8*a*, 9*a*, 10*a*, 11*a* and 12*a* (networks 4*a* through 11*a* are not shown) for the respective counter stages 1, 2, 3, 4, 5, 6, 7, 8, 9, 10, 11 and 12. Each control network has a selective relay controlled input, the relays 1*b*, 2*b*, 3*b*, 4*b*, 5*b*, 6*b*, 7*b*, 8*b*, 9*b*, 10*b*, 11*b* and 12*b* (relays 4*b* through 11*b* are not shown) being respectively energized as desired by punched tape, for example, during different operational periods to establish the relay switching connections to the respective control networks 1*a* through 12*a*. The output of the rate divider circuit is normally not used during a change of divisor transition interval, including the time necessary immediately following for properly filling the digital counter. A voltage regulator tube T5 provides −130 volts on lead 42 through resistor R4. This negative voltage is applied to the left or right input leads of each control network as determined by the energization of the relays. Of course, relay control is purely illustrative and other switching means can be employed. Electronic switches, or simply manually operated switches can be used according to the application of the invention. Further, when electronic switches are used, for example, reset data (such as step voltages or the lack thereof) provided from an electronic computer can be suitably programmed to set (applied to) the switches only at the beginning of a reset pulse, so that no disturbance is created in the flow of output signals from the rate divider circuit. For this mode of operation, the computer clock source can be used to supply or control the reference frequency input signal to the rate divider circuit, and thus establish and maintain synchronism with computer operation. The voltage regulator T5 also provides, for example, −15 volts on lead 44, which is obtained from potentiometer 46 connected across the V—R tube T5.

The control networks are all identical, and, as detailed for the control network 1*a*, each can have a relay controlled input for establishing the reset condition of the counter stage connected to the output of the control network. The same resetting input signal, which is the negative blocking oscillator output reset pulse, is fed to each of the control networks on lead 40. The left contact of relay 1*b* is connected to the right contact through four series connected resistors R5, R6, R7 and R8. The common junction between resistors R5 and R6 is connected to capacitor C5 through resistor R9, and the common junction between resistors R7 and R8 is similarly connected to capacitor C6 through resistor R10. The capacitors C5 and C6 are respectively connected to the control grids of tubes T1 and T2 through resistors R11 and R12 of the counter stage 1. The lead 44 is connected to the common junction between resistors R6 and R7, placing that point at −15 volts, for example. Lead 40 supplying the negative resetting blocking oscillator signals, is connected through two negatively oriented diodes D4 and D5 respectively to the common junctions between resistors R5 and R6, and resistors R7 and R8.

Operation of the rate divider circuit will be described for a constant frequency sine wave input signal of one megacycle per second, and a blocking oscillator negative resetting pulse having a width of 3 microseconds. Other input frequencies can, of course, be employed and the blocking oscillator resetting control pulse width can be any desired predetermined width sufficient to at least cover the time duration necessary for the resetting operation and counter response speed for the twelve counter stages. The resetting pulse width is selected to be an integral multiple of input triggering cycles so that a known and definite number of input trigger cycles are encompassed over each resetting pulse width when the counter is not counting (blanked). The one megacycle per second input signal to the twelve stage counter is equal to a rate of input trigger impulses provided once every microsecond. The counter therefore has a digit input once every microsecond, but there is inherently some minimum time interval necessary for resetting the binary contents of the counter at each counter overflow or output signal from the last stage 12. This is true even though the blocking oscillator circuit provides an extremely rapid pulse fall time of about 0.25 microsecond. Thus, 3 microseconds should fairly well cover the time delay necessary for complete circuit response, and the selected pulse width equal to an integral number of cycles of the input triggering rate of one megacycle per second insures that exactly three digits (trigger impulses) will be lost or unused during the resetting operation, instead of the loss of an unknown and possibly variable number of digits each time. Response of the first counter stage 1 to the sine wave triggering signal occurs during the negative fall portion of each cycle, and divider accuracy is accordingly well within one trigger cycle period or less than ±1 microsecond with the one megacycle per second input signal.

The output pulses from potentiometer 34 are each, of course, also 3 microseconds wide, as governed primarily by the delay line 28 in the blocking oscillator circuit. It follows that the maximum, distinguishable divided output pulse rate is one fourth of one megacycle per second or approximately 250 kilocycles per second. Minimum, divided output pulse rate is determined primarily by the capacity of the counter provided. For the twelve stage counter described above, the minimum output pulse rate is one megacycle per second divided by 4099 ($=2^{12}+3$) or 244 cycles per second. The counter capacity of $2^{12}$ is increased by three digits in determining the minimum output pulse rate because of the 3 microseconds delay introduced by the delay line 28.

Suppose that it is desired to divide the input frequency of one megacycle per second by, for example, 2047. Since 3 microseconds delay is already included by the delay line 28 of the blocking oscillator circuit 26, and one megacycle per second yields an input trigger rate of once every microsecond or one digit per microsecond, three digits are subtracted from 2047, giving 2044, which is to be set up by energization of the proper relays to the control networks 1*a*, 2*a*, 3*a*, 4*a*, 5*a*, 6*a*, 7*a*, 8*a*, 9*a*, 10*a*, 11*a* and 12*a*. The number 2044 is first converted into binary form as 011111111100. If, now, all of the counter stages each was in a condition which represented a 1 digit, all of the right hand tubes such as T2 of stage 1 would be non-conducting and the right anode voltage would be high. The next input triggering signal would immediately produce an output pulse from the last stage 12. This counter overflow pulse would also be a positive pulse since the output is obtained from the anode of the left hand tube in the last stage 12. Assuming that all of the counter stages can be immediately reset (i.e., there is no delay anywhere) to contain all 1 digits, another input triggering signal would again immediately produce another output pulse from the last stage 12. To produce one counter output pulse for every two input trigger signals, the binary contents of all of the counter stages except the least significant digit (stage 1) of the counter should be each reset to a 1 digit while stage 1 only is reset to a 0 digit. The counter should be theoretically reset fully without any delay, of course.

To divide by three, the binary content of the second least significant digit (stage 2) only should be reset to a 0 digit, while all of the other stages are reset to a 1 digit condition for each counter output pulse. To divide by four, both stages 1 and 2 should be reset to 0 digits with the other stages all being reset to 1 digits for each counter overflow (output) pulse. This continues in binary fashion and it is evident that the register complement of the dividing number is to be reset in the counter at each overflow (output) pulse. The register complement is the binary number obtained wherein the 0 digits and 1 digits of an original binary number are changed from one to the other; that is, a 0 digit is rewritten as a 1 digit and a 1 digit is rewritten as a 0 digit for the register complement. The register complement is one digit less than the true complement of a binary number. Accordingly, the register complement of 011111111100 (2044) is 100000000011, which is to be reset in the twelve stage counter for each counter overflow output pulse. This establishes a divisor of 2047 since there is a 3 microsecond delay provision.

The negative reset pulse provided by the blocking oscillator circuit 26 is applied to all of the control networks on lead 40. For the control network 1*a*, the −80 volts, 3 microsecond width pulse is applied through the negatively oriented diodes D4 and D5. If the relay 1*b* is not energized so that −130 volts is applied to the left hand relay contact, the common junction between resistors R5 and R6 is at −72 volts potential, for example, and the common junction between resistors R7 and R8 is at −15 volts potential, since this latter voltage is provided on lead 44 to the common junction between resistors R6 and R7. If the relay 1*b* is energized, the −72 volts potential appears at the common junction between resistors R7 and R8, of course, and −15 volts now exists at the common junction between resistors R5 and R6. Thus, when the −80 volts reset pulse appears through the diodes D4 and D5, and with −72 volts on the anode of diode D4 and −15 volts on the anode of diode D5 (relay 1*b* is not energized), −8 volts (=72−80) are impressed through the series combination of resistor R9, capacitor C5 and resistor R11 and further attenuated so that only a few negative volts are applied to the control grid of tube T1 whereas −65 volts (=15−80) are impressed through the series combination of resistor R10, capacitor C6 and resistor R12 and further attenuated, but still providing a large negative voltage which is applied to the control grid of tube T2. This large negative voltage effectively cuts off the tube T2 (−30 volts required, for example, to cut off a tube) placing stage 1 in a 1 digit condition. It is noted that a much larger positive voltage (impulse or step) is required on the grid of an off tube to trigger the bistable multivibrator 24. Thus, the tube T2 is unaffected by the trailing edge of the negative reset pulse. Similarly, if the relay 1*b* was energized, the tube T1 would be left cut off and a 0 digit is set in stage 1. Summarizing, when a relay connects the −130 volts on lead 42 to the left hand contact of a relay, the corresponding counter stage is reset by the reset pulse on lead 40 to represent a 1 digit, and when the −130 volts is applied to the right hand contact, the counter stage is reset to represent a 0 digit.

The left hand relay contacts can be labeled "0" and the right hand contacts can be labeled "1" as shown in FIGURE 1. By energizing the proper relays to produce the binary divisor (delay corrected) number desired according to the labeling of the relay contacts, the register complement is automatically set up. The number 2044 in binary form 011111111100 can therefore be directly entered in the control relays by energizing all of the relays except the first two left end relays and the right end (most significant digit) relay.

Figure 2:
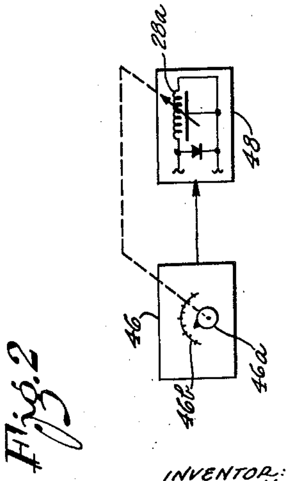
FIGURE 2 is a diagrammatic drawing showing a means for varying pulse width of the reset pulse with frequency change of the input reference frequency signal.

Negative trigger impulses can be provided for the input signal instead of the one megacycle per second sine wave. The negative trigger impulses can be of smaller magnitude than the sine wave since only the negative drop (of fast fall time) of the sine wave is utilized for triggering. The trigger impulses, moreover, are preferred for lower input frequencies. When different input frequencies are used, the reset pulse width can be easily varied by providing a delay line 28 which can be adjusted in delay time. This can be accomplished by providing an adjustable length (shorted) delay line. The length of a distributed parameter delay line can be varied by adjusting the position of the shorting element. However, a lumped parameter delay line requires a multiple position switch having contacts connected to the different junctions between series connected sections of a multiple section, lumped parameter shorted delay line, for switching in or out sections connected ahead of the last, shorted termination section. Alternately, the section inductance and capacitance elements can be adjustable components which are suitably coupled for simultaneous adjustment thereof. FIGURE 2 schematically illustrates the manual adjustment of delay time and therefore the width of the reset pulse by mechanically coupling the frequency adjustment or selector knob 46*a* of a source of trigger signals 46 to an adjustable delay line 28*a* in a rate divider circuit 48. The knob 46*a* indicates against a scale 46*b* which is calibrated in frequency, and any suitable mechanical coupling means can be used to connect the knob 46*a* with the adjustable delay line 28*a*. Thus, the width of the reset pulse can be kept equal to some integral number of cycles of the input frequency.

Figure 3:
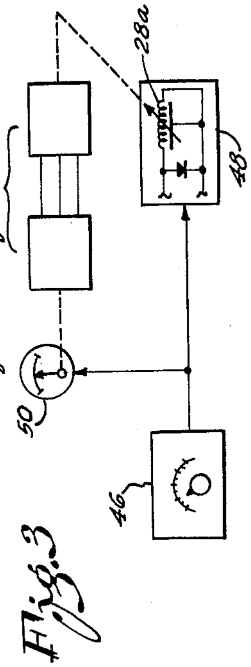
FIGURE 3 is a block diagram illustrating a method for varying the pulse width of the reset pulse automatically with fluctuation or change of the input reference frequency.

FIGURE 3 shows in block diagram form an automatically adjusted delay line 28*a* in a rate divider circuit 48. Components similar to those in FIGURE 2 are identified by the same numbers used in FIGURE 2. A source of trigger signals 46 is adjustable to provide different output frequencies, or the source 46 can have a fluctuating or variable output frequency. In either instances, the output of the source 46 is provided to the rate divider circuit 48 as well as to a frequency meter 50. The frequency meter 50 is, for example, a counting rate meter comprising a capacitance storage counter having a vacuum tube voltmeter connected across its output. The output of the counting rate meter is suitably coupled to the adjustable delay line 28*a* through a synchro tie 52. Of course, a servo connecting network including a potentiometer (which can be linear or nonlinear as required) providing a feedback signal to be compared with the input signal from the frequency meter 50 for an error signal, can be utilized. It is to be noted that the accuracy of the rate divider circuit 48 is maintained in normal use in spite of a fluctuating or varying input frequency since the digital counter in the rate divider circuit 48 does not produce overflow output pulses at a high rate. That is, the divisor is usually a fairly large number, and the adjustable delay line 28*a* can be adjusted before the generation of an output pulse. Further, excessive rapid fluctuations or extremely high output rates are averaged out by this system.

From the above description it will be apparent that there is thus provided a device of the character described possessing the particular features of advantage before enumerated as desirable, but which is obviously susceptible of modification in its form, proportions, detail construction and arrangement of parts without departing from the principle involved or sacrificing any of its advantages.

My invention has been described in language more or less specific as to structural features in order to comply with the statute. It is to be understood, however, that the invention is not limited to the specific features shown, but that the means and construction herein disclosed comprise the preferred form of several modes of putting my invention into effect, and the invention is, therefore, claimed in any of its forms or modifications within the legitimate and valid scope of the appended claims.

I claim:

1. A rate divider circuit, comprising: a fixed capacity digital counter having a predetermined number content provided therein, said counter including an input adapted to receive a trigger signal of a reference frequency and responsive to each cycle of the trigger signal by cumulatively increasing the predetermined number content by a digit, and an output for providing a cycle of output signal when the predetermined number content of said counter is cumulatively increased to exceed the capacity thereof by a digit; means for generating a reset pulse responsively to each cycle of the output signal, each reset pulse being of a predetermined pulse width equal in time duration to an integral number of cycles of the trigger signal; and means for applying each reset pulse to said counter for resetting the same to the predetermined number content, whereby a cycle of the output signal is produced for a definite number of cycles of the trigger signal according to the predetermined number content originally provided in said counter.

2. The invention according to claim 1 wherein said reset pulse generating means includes a blocking oscillator circuit having a delay line for controlling pulse width of the reset pulse, said blocking oscillator circuit being responsively connected to the output of said counter.

3. A rate divider circuit, comprising: an *n*-stage digital counter of a fixed capacity and having a predetermined number content provided therein, said counter including an input adapted to receive a trigger signal of a reference frequency and responsive to each cycle of the trigger signal by cumulatively increasing the predetermined number content by a digit, and an output for providing a cycle of output signal when the predetermined number content of said counter is cumulatively increased to exceed the capacity thereof by a digit; means for generating a cycle of reset signal responsively to each cycle of the output signal, each cycle of reset signal being equal in time duration to an integral number of cycles of the trigger signal; and *n* control networks connected respectively to the *n* stages of said counter for applying each cycle of the reset signal to corresponding stages of said counter for resetting the same to the predetermined number content, whereby a cycle of the output signal is produced for a definite number of cycles of the trigger signal according to the predetermined number content originally provided in said counter.

4. The invention according to claim 3 wherein the *n* stages of said counter are bistable binary counter stages, and said *n* control networks include respective switching means which are selectively operable from one condition to another to control application of each cycle of the reset signal to each of the *n* stages of said counter, whereby a bistable binary counter stage is reset to one stable state when the switching means of the corresponding control network is in the one condition and to another stable state when the switching means is operated to the other condition.

5. The invention according to claim 3 wherein said reset signal generating means includes a blocking oscillator circuit responsively connected to the output of said counter, for generating a reset pulse signal of predetermined pulse width equal in time duration to an integral number of cycles of the trigger signal for each cycle of the output signal.

6. The invention according to claim 5 wherein said blocking oscillator circuit includes adjustable delay line means for controlling the pulse width of the reset pulse.

7. The invention according to claim 6 including, in addition, a frequency meter for measuring the reference frequency of the trigger signal and producing an output signal proportional to the reference frequency, and means responsive to the output signal of said frequency meter for adjusting said delay line means to vary the pulse width of the reset pulse according to the reference frequency of the trigger signal.

8. The invention according to claim 4 wherein each control network comprises switching means having an input terminal selectively connectable to first and second output terminals, a first, second, third and fourth resistor connected in series between the first and second output terminals of said switching means, a first bias connected to the input terminal of said switching means, a second bias connected to the series junction between said second and third resistors, means connecting the series junction between said first and second resistors to one half of a corresponding bistable counter stage, means connecting the series junction between said third and fourth resistors to the other half of the bistable counter stage, and means connecting the reset signal to the series junctions between said first and second resistors and said third and fourth resistors, whereby the reset signal is applied to the two halves of the bistable counter stage in respectively different magnitudes according to the condition of said switching means in connecting the input terminal selectively to the first and second output terminals for resetting the corresponding bistable counter stage to a desired state.

9. The invention according to claim 7 in which said adjusting means comprises a synchro network having a transmitter coupled to an output shaft of said frequency meter and a receiver connected to adjust said delay line means to vary the pulse width of the reset pulse.

10. A rate divider circuit, comprising: a fixed capacity digital counter of $n$ bistable counter stages and having a predetermined number content provided therein, said counter including an input adapted to receive a trigger signal of a reference frequency and responsive to each cycle of the trigger signal by cumulatively increasing the predetermined number content by a digit, and an output for providing a cycle of output signal when the predetermined number content of said counter is cumulatively increased to exceed the capacity thereof by a digit; a blocking oscillator circuit connected to the output of said counter for generating a reset pulse signal of predetermined pulse width equal in time duration to an integral number of cycles of the trigger signal, for each cycle of the output signal; and $n$ control networks connected respectively to the $n$ stages of said counter for applying each reset pulse to corresponding stages of said counter for resetting the same to the predetermined number content, each control network including switching means having an input terminal selectively connectable to first and second output terminals, a first, second, third and fourth resistor connected in series between the first and second output terminals of said switching means, a first bias connected to the input terminal of said switching means, a second bias connected to the series junction between said second and third resistors, means connecting the series junction between said first and second resistors to one half of a corresponding bistable counter stage, means connecting the series junction between said third and fourth resistors to the other half of the bistable counter stage, and unidirectional conducting means connecting the reset pulse signal of said blocking oscillator circuit to the series junctions between said first and second resistors and said third and fourth resistors, whereby each reset pulse is applied to the two halves of the corresponding bistable counter stage in respectively different magnitudes according to the condition of said switching means in connecting the input terminal selectively to the first and second output terminals for resetting the corresponding bistable counter stage to a desired state.

11. The invention according to claim 10 wherein said blocking oscillator circuit includes adjustable delay line means for controlling the pulse width of the reset pulse, and including, in addition, a frequency meter for measuring the reference frequency of the trigger signal and producing an output signal proportional to the reference frequency, and means responsive to the output signal of said frequency meter for adjusting said delay line means to vary the pulse width of the reset pulse according to the reference frequency of the trigger signal.

References Cited in the file of this patent

UNITED STATES PATENTS

| | | |
|---|---|---|
| 2,700,102 | Woodward | Jan. 18, 1955 |
| 2,760,315 | Wilckens et al. | Aug. 28, 1956 |
| 2,767,313 | Martinelli | Oct. 16, 1956 |